United States Patent [19]
Jacob

[11] 4,362,632
[45] Dec. 7, 1982

[54] GAS DISCHARGE APPARATUS

[75] Inventor: Adir Jacob, Framingham, Mass.

[73] Assignee: LFE Corporation, Clinton, Mass.

[21] Appl. No.: 494,024

[22] Filed: Aug. 2, 1974

[51] Int. Cl.³ .......................... C23F 1/00; C23C 15/00
[52] U.S. Cl. .............................. 422/183.04; 156/345; 156/643; 204/192 E; 204/164; 204/298
[58] Field of Search ............... 250/527, 528, 530, 531; 156/345, 643; 204/164, 193, 192 E, 298

[56] References Cited

U.S. PATENT DOCUMENTS

| | | | |
|---|---|---|---|
| 2,849,357 | 8/1958 | Devins et al. | 204/177 |
| 3,410,776 | 11/1968 | Bersin | 204/193 |
| 3,428,548 | 2/1969 | Hollahan | 250/531 |
| 3,437,864 | 4/1969 | Kofoid et al. | 204/192 X |
| 3,503,711 | 3/1970 | Skala | 23/232 |
| 3,526,584 | 9/1970 | Shaw | 204/192 |
| 3,536,602 | 10/1970 | Jones | 204/164 |
| 3,573,192 | 3/1971 | Bersin et al. | 250/531 |
| 3,616,461 | 10/1971 | Gorin | 250/531 |
| 3,619,403 | 11/1971 | Gorin | 250/531 |
| 3,647,676 | 3/1972 | Bersin | 250/531 |
| 3,671,195 | 6/1972 | Bersin | 23/230 PC |
| 3,674,666 | 7/1972 | Foster et al. | 204/164 |
| 3,705,091 | 12/1972 | Jacob | 250/531 |
| 3,775,621 | 11/1973 | Gorin | 250/531 |
| 3,879,597 | 4/1975 | Bersin et al. | 219/121 P |

*Primary Examiner*—Aaron Weisstuch
*Attorney, Agent, or Firm*—Lahive & Cockfield

[57] ABSTRACT

The admission of a gas to a reaction chamber which has been previously evacuated is followed by its excitation by either a high-frequency electrostatic field or an electromagnetic field, formed by capacitor plates or a coil, respectively, which envelops the outer wall of the reaction chamber. A perforated metallic cylinder is disposed within the chamber concentrically with the long axis of the chamber and comprises the material-handling zone of the chamber. The activated gas reacts with material placed within the perforated cylinder, during which reaction inactive gas and resultant gaseous byproducts are continuously withdrawn. The construction of the chamber and the internal perforated metallic cylinder are such as to provide very uniform distribution of gaseous excited species throughout the entire material-processing volume within the cylinder thereby promoting very uniform chemical conversions of practical interest.

10 Claims, 1 Drawing Figure

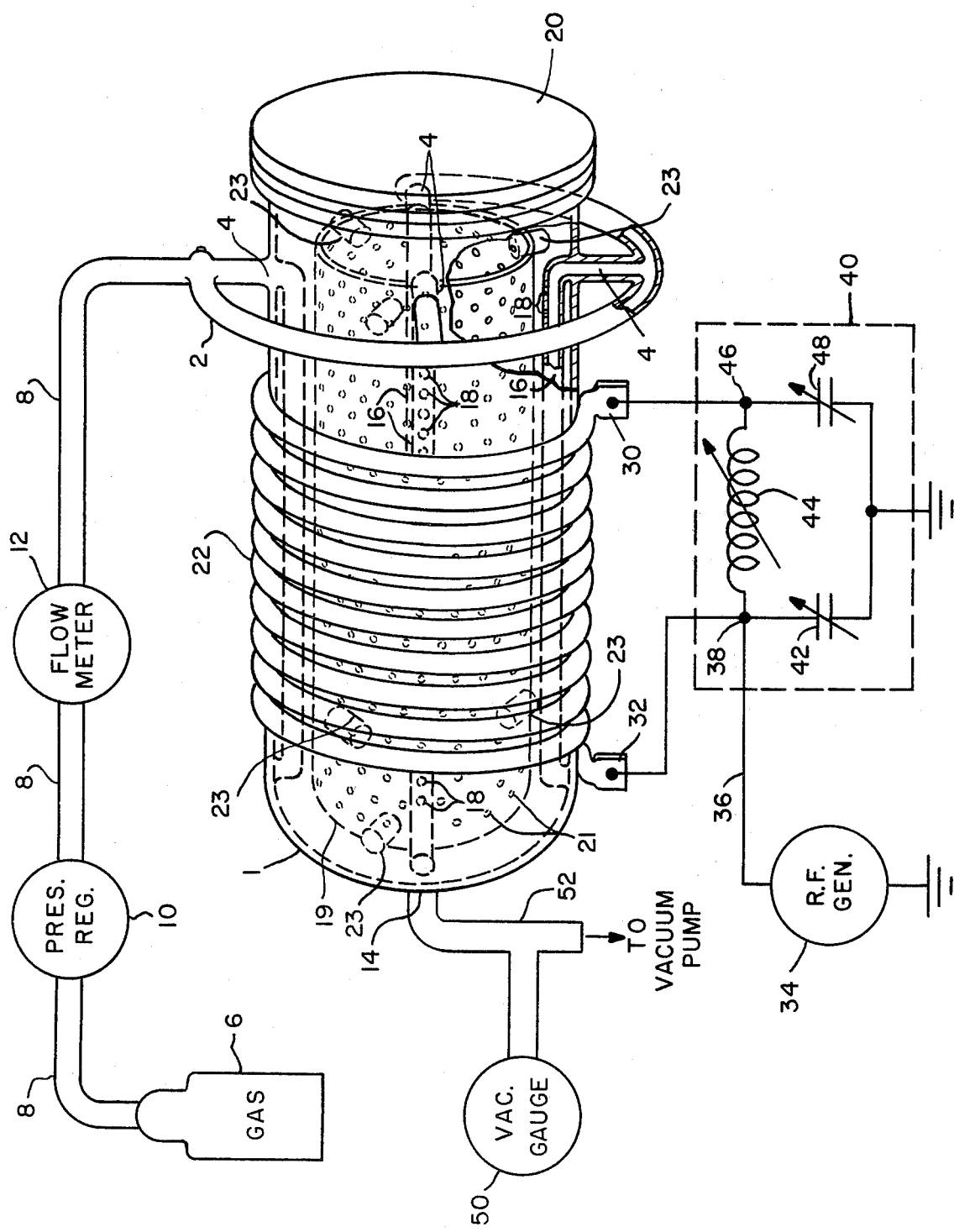

GAS DISCHARGE APPARATUS

BACKGROUND OF THE INVENTION

This invention relates to gas discharge apparatus and, more particularly, it is concerned with an improved means for producing a gaseous plasma facilitating efficient and uniform conversions during heterogeneous (gas-solid) reactions.

In U.S. Pat. No. 3,619,403, assigned to LFE Corporation, there is disclosed improved apparatus for inducing reactions between a material and activated (excited) species of a gas. As described therein, a gas is fed into a reaction chamber at a low pressure and is activated by means of an electromagnetic field formed about a conventionally-wound coil which envelops the material-handling zone of the chamber. During reaction with the activated gas stream (plasma) the material decomposes and/or volatilizes. The resultant byproducts, along with other gaseous constituents, are withdrawn from the chamber by means of a mechanical vacuum pump.

Gas reaction systems of the type described above are being used to great advantage in a variety of industrial processes including, for example, the process of manufacturing integrated circuit components from semiconductor substrates. Such systems provide an economical, safe, and rapid means for selectively removing exposed layers of material from predetermined areas during the various steps involved in the manufacturing process. However, a basic problem encountered with such systems has been their inability to render a sufficiently uniform distribution of reactive chemical conversions throughout the material-handling zone required for production-sized batches of such substrates. Consequently, some of the semiconductor substrates are overexposed to the plasma environment, causing degradation of material and malfunctioning of the final device.

In U.S. Pat. No. 3,705,091 issued to the present inventor and assigned to LFE Corporation, there is disclosed an improved apparatus of the aforementioned nature. This patent discloses, inter alia, a unique coil arrangement about the reaction chamber which produces a substantially uniform distribution of active species throughout the material-handling volume within the chamber. Although chemical conversions occur significantly more uniformly throughout production-size batches of material with this coil arrangement, it has been found that unskilled operators sometimes spend a considerable amount of time in optimizing the system parameters; e.g., rf power, reaction pressure, and their unique combinations, for the quantitative and qualitative variances encountered in different batches of substrate material.

Accordingly, the general object of the present invention is to provide a further improved apparatus of the aforementioned character, whereby uniform heterogeneous reactions are accomplished throughout the material-handling volume of a reaction chamber regardless of operator's skill, and functionally independent of the nature of the substrate material.

SUMMARY OF THE INVENTION

The present invention provides an apparatus for generating an excited gas and reacting the gas with material placed within a reaction chamber. The reaction chamber is adapted to receive and expel a gas, and means are provided external of said chamber for forming a plasma discharge within the chamber. A gas-pervious metallic element positioned within the chamber provides a glow-free material-handling volume within the chamber, whereby material placed within this volume is shielded from nonuniformly distributed and field-perturbed energetic ionized species of the gas.

DESCRIPTION OF PREFERRED EMBODIMENT

The novel features of the present invention, together with further objects and advantages, will become apparent from the following detailed description of a preferred embodiment of the invention and from the accompanying drawing to which the description refers.

The drawing is an illustration in diagrammatic form of a gas discharge system constructed in accordance with the principles of the present invention.

With reference to the drawing, it will be observed that reference numeral 1 designates a reaction chamber having an input manifold 2 whose outlets are coupled to four gas inlet ports 4 which are symmetrically disposed about the circumference of the chamber. A container 6 of compressed gas or vapor is coupled to the inlet manifold 2 by way of a feedline 8 having inserted therein a pressure regulator valve 10 and an adjustable flow meter 12 for monitoring and controlling gaseous flow rates throughout the system. Gas is exhausted from the chamber via the gas outlet port 14.

A portion of the reaction chamber 1 is shown broken away in the drawing to better illustrate one of the four gas diffusion tubes 16 which are fused to the gas inlet ports 4 and are symmetrically disposed along the inner wall of the chamber. Each of the tubes 16 has a plurality of holes (jets) 18 along its length which uniformly distribute the gas within the chamber.

Within the chamber 1 is a metallic cylinder 19 having perforations 21 therein. The cylinder 19 is concentrically positioned about the long axis of the chamber by support members 23 which may be fused to the inner wall of the chamber.

Chamber 1 has an opening at one end for material to be inserted into or removed from its material-handling zone. This material-handling zone is comprised of the volume within the interior of the perforated metallic cylinder 19. The material to be handled may, for example, consist of a tray of semiconductor slices from which it is desired to etch away exposed portions of a dielectric, semiconductive, or a conductive layer. The chamber's opening is provided with a closure in the form of a cap-like cover 20 which is fitted tightly over the opening after the material is inserted.

Surrounding the material-handling zone of the chamber 1 inductive coil 22 which is adapted to couple an electromagnetic field of the gas within the chamber.

An rf generator 34 has one output lead 36 connected to the input terminal 38 of an impedance matching network 40, and its other output lead connected to a ground reference terminal. The matching network 40 includes a variable capacitor 42 connected between its input terminal 38 and ground, a variable inductor 44 connected between its input terminal 38 and its output terminal 46, and a variable capacitor 48 connected between its output terminal 46 and the common ground. One end 32 of coil 22 is connected to the input terminal 38 of the impedance matching network, while the other end 30 of coil 22 is connected to the output terminal 46 of the impedance matching network. The outlet port 14 of the reaction chamber 1 is connected to a vacuum gauge 50, which continuously measures the pressure maintained within the chamber, and also to a mechanical vacuum pump (not shown) by way of exhaust line 52.

In operation, the material, parts of which are to be removed or plasma-treated, is introduced into the material-handling volume defined by the interior of the perforated metallic cylinder 19. This cylinder is preferably inserted to the rear of chamber 1 in such a way as to touch the chamber's interior wall surrounding exhaust port 14 and is maintained at a floating potential.

The system is initially pumped down to a preset low pressure level and the gas is then automatically admitted to the chamber via the diffusion tubes 16, and the rf generator 34 is then enabled to deliver its energy. The coupling of rf energy into the gas is achieved by means of the matching network 40 and the coil 22 that surrounds the material-handling zone of the chamber. The power provided by generator 34 is preferably in the order of a few hundred watts continuous radiation at a frequency of approximately 13.5 MHz.

The unique construction of this ensemble is such that a highly luminous and active plasma discharge is generated predominantly outside the material-handling volume of the metallic cylinder 19 and is confined substantially to the annular volume between the chamber's interior wall and the outside surface of the perforated cylinder. This condition creates a zone within the cylinder's volume practically void of otherwise nonuniformly distributed and field-perturbed energetic ionized gaseous species. Both the external and internal surfaces of the metallic cylinder provide for catalytic recombinations of atomic entities and for the quenching of energetic ionized molecular and atomic states. The lack of chemical luminosity within the perforated cylinder's volume is indicative of the pronounced deficiency in charged species within the cylinder, while their formation from bimolecular and termolecular collisions of prevailing moderate neutral active species is insignificant. The exclusive existence of neutral molecular or atomic entities which are essentially uniformly dispersed within the cylinder's volume promotes uniform chemical conversions as such entities are unaffected by field effects, ever so small as they may be, within the perforated metallic volume. Since, commonly, a larger fraction of neutral atomic species recombines preferentially on the cylinder's internal metallic surface than on the nonmetallic substrate material placed within the cylinder, the corresponding processing temperature is substantially reduced over its value prevailing within the highly luminous zone outside the perforated volume. In this fashion, plasma-induced etching reactions of dielectric, semiconducting, and conducting material can proceed at relatively low temperatures (100° C.), uniformly, and unperturbed, as radial and longitudinal concentration gradients, which are otherwise substantially enhanced by electric field couplings, are practically nonexistent. Common longitudinal concentration gradients due to dynamic pressure drops and radial concentration gradients due to frictional effect barely manifest themselves across typical production batches of substrates which are several inches in length and of a few inches in diameter.

It is believed, however, that optimum diameter ratios exist between the diameter of the chamber and the diameter of the metallic cylinder so as to provide for optimum annular volume within which the plasma is generated. The individual size of the perforations 21 should be small enough to preclude field penetration and exclude chemical luminosity from the interior of the cylinder, and large enough for easy access of ample active neutral particles to effect chemical conversions at practical rates.

Applicant has found, for example, that with a chamber having an eight-inch diameter, optimum results were achieved using a steel cylinder of 0.057 inch thickness having a five-inch diameter, and having a matrix of one-eighth inch holes therein with a center-to-center spacing of five-sixteenth inches.

Volatile components produced by the various reactions, as well as unreacted and undissociated gas, are continuously removed from the chamber by action of the mechanical vacuum pump. The termination of the reaction process is marked by rf energy and gas supply cut off, followed by the evacuation of the chamber and associated flow lines from gaseous residuals prior to their being purged with air.

While there has been shown what is at present considered to be the preferred embodiment of the invention, it will be obvious to those skilled in the art that various changes and modifications may be made thereto within the scope contemplated by the invention. For example, it has been previously mentioned that the gas-exciting field may be an electrostatic field formed by a pair of capacitor plates disposed on the outer surface of the reaction chamber, rather than an electromagnetic field formed by a coil, as illustrated in the drawing. In addition, the perforated enclosing metallic structure within the chamber need not necessarily be cylindrical in shape. In this regard, applicant has conducted successful tests of his invention utilizing an eighteen-inch diameter chamber having capacitor plates thereabout and having a square perforated metallic box therein which contained a large number of small articles to be plasma surface treated. The metallic structure may be coated with a material, in instances where the base metal surface of the metallic structure is incompatible with the plasma atmosphere. Thus, favorable surface-catalyzed recombinations and quenching reactions may be achieved for a wide variety of chemical environments. In certain applications, it may be desirable to provide a potential upon the metallic structure with respect to the plasma. Consequently, the invention herein described is to be construed to be limited only by the spirit and scope of the appended claims.

I claim:

1. Apparatus for reacting a gas with a material comprising:
   an evacuable reaction chamber adapted to receive and expel a gas,
   means external of said chamber for forming a gaseous plasma within said chamber,
   means for introducing material to be modified by reaction into said chamber and for removing modified material from said chamber, and
   a metallic shielding structure having a multiplicity of openings therein disposed within said chamber adapted to provide a glow-free material-placement zone within the confines of said metallic structure containing neutral active species and substantially void of nonuniformly distributed and field-perturbed gaseous ionized species formed within said chamber external of said shielding structure.

2. The apparatus of claim 1 wherein said reaction chamber has a generally cylindrical shape and wherein said means for forming a gaseous plasma within said chamber includes a coil disposed about the outer wall of said chamber.

3. The apparatus of claim 1 wherein said reaction chamber has a generally cylindrical shape and wherein said means for forming a gaseous plasma within said chamber includes a pair of capacitor plates disposed on the outer wall of said chamber.

4. The apparatus of claim 1 wherein said reaction chamber has a generally cylindrical shape and wherein said metallic structure comprises a cylinder coaxial with said chamber and having perforations therethrough.

5. The apparatus of claim 1 wherein said metallic structure is coated with a material unaffected by excited gaseous species formed within said chamber.

6. The apparatus of claim 1 wherein said metallic structure comprises a cylindrical screen.

7. Apparatus for reacting a gas with a material in the influence of an rf electromagnetic field comprising:
   an evacuable reaction chamber having a generally cylindrical shape,
   closure means at one end of said chamber for introducing material to be modified by reaction into said chamber and for removing modified material from said chamber,
   means for introducing a gas within said chamber,
   means for withdrawing the gas from said chamber,
   means including a coil disposed about the outer wall of said chamber for forming an rf electromagnetic field within said chamber, and
   a perforated metallic cylinder coaxially disposed within said chamber, said perforated metallic cylinder providing a material processing zone therewithin substantially unaffected by nonuniformly distributed and field-perturbed gaseous ionized species formed within said chamber external of said cylinder.

8. A plasma etching device comprising:
   a cylinder having an end wall and an opposing front opening adapted to receive and expel a gas;
   electrodes surrounding said cylinder and connected to a source of radio frequency energy;
   a perforated cylinder of electrically conductive material within, concentric to, and spaced from the wall of said cylinder, and formed such that it provides a substantially glow free material handling volume within it;
   said perforated cylinder being large enough in diameter to contain within it the material to be etched.

9. A plasma etching device comprising:
   a cylinder having an end wall and an opposing front opening adapted to receive and expel a gas;
   electrodes surrounding said cylinder and connected to a source of radio frequency energy;
   a perforated structure of electrically conductive metal within and spaced from the wall of said cylinder, said perforated metal structure being large enough to contain within it the material to be etched and formed such that said material is shielded from energetic ionized species of gas.

10. A plasma etching device comprising:
    a cylinder having an end wall and an opposing front opening adapted to receive and expel a gas;
    a coil surrounding said cylinder and connected to a source of radio frequency energy;
    a perforated structure of electrically conductive material enclosing a substantially glow free material handling volume within, and spaced from the wall of said cylinder, said perforated structure being large enough in diameter to contain within it the material to be etched.

* * * * *